US010698678B2

(12) United States Patent
Liu et al.

(10) Patent No.: US 10,698,678 B2
(45) Date of Patent: Jun. 30, 2020

(54) METHOD FOR ONLINE UPDATING FIRMWARE OF COMPLEX PROGRAMMABLE LOGIC DEVICE

(71) Applicants: INVENTEC (PUDONG) TECHNOLOGY CORPORATION, Shanghai (CN); INVENTEC CORPORATION, Taipei (TW)

(72) Inventors: Jian-Fei Liu, Shanghai (CN); Hai-Tao Fang, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 32 days.

(21) Appl. No.: 16/153,729

(22) Filed: Oct. 6, 2018

(65) Prior Publication Data
US 2020/0097278 A1    Mar. 26, 2020

(30) Foreign Application Priority Data
Sep. 21, 2018    (CN) .......................... 2018 1 1110580

(51) Int. Cl.
*G06F 9/44*    (2018.01)
*G06F 8/65*    (2018.01)
*G06F 13/40*    (2006.01)

(52) U.S. Cl.
CPC ............ *G06F 8/65* (2013.01); *G06F 13/4004* (2013.01)

(58) Field of Classification Search
CPC ............................... G06F 8/65; G06F 13/4004
USPC ....................................................... 717/170
See application file for complete search history.

(56) References Cited

U.S. PATENT DOCUMENTS

| 9,710,255 B1* | 7/2017 | Han | G06F 8/65 |
| 9,798,534 B1* | 10/2017 | Yi | G06F 11/1076 |
| 2009/0279549 A1* | 11/2009 | Ramanathan | G06F 8/65 370/395.4 |
| 2010/0325404 A1* | 12/2010 | Aldereguia | G06F 8/65 713/2 |
| 2015/0365781 A1* | 12/2015 | Han | H04W 4/80 455/41.2 |

(Continued)

OTHER PUBLICATIONS

Title: The firmware development of a portable inertial measurement unit (IMU) author: X Cui published on 2014.*

*Primary Examiner* — Chameli Das
(74) *Attorney, Agent, or Firm* — Maschoff Brennan

(57) ABSTRACT

A method for updating a firmware of a complex programmable logic device comprises: electrically connecting a general purpose input/output pin of a baseboard management controller with a hitless enable pin of a complex programmable logic device; electrically connecting a first integrated circuit bus of the baseboard management controller with a second integrated circuit bus of the complex programmable logic device; inputting and transmitting a update command to the baseboard management controller by a local operating system; enabling the hitless enable pin by the baseboard management controller according to the update command; cleaning a first firmware in the complex programmable logic device by the baseboard management controller according to the update command; and burning a second firmware into the complex programmable logic device by the baseboard management controller according to the update command.

6 Claims, 3 Drawing Sheets

(56) References Cited

U.S. PATENT DOCUMENTS

| | | | |
|---|---|---|---|
| 2016/0019051 A1* | 1/2016 | Joshi | G06F 8/65 |
| | | | 717/170 |
| 2016/0062761 A1* | 3/2016 | Muroyama | H04L 67/34 |
| | | | 717/171 |
| 2016/0092202 A1* | 3/2016 | Filali-Adib | G06F 9/445 |
| | | | 717/168 |
| 2016/0269954 A1* | 9/2016 | Purohit | H04L 67/1008 |
| 2017/0192768 A1* | 7/2017 | Han | G06F 8/65 |
| 2018/0007147 A1* | 1/2018 | Sareen | H04L 41/0893 |

* cited by examiner

METHOD FOR ONLINE UPDATING FIRMWARE OF COMPLEX PROGRAMMABLE LOGIC DEVICE

CROSS-REFERENCE TO RELATED APPLICATIONS

This non-provisional application claims priority under 35 U.S.C. § 119(a) on Patent Application No(s). 201811110580.4 filed in China on Sep. 21, 2018 the entire contents of which are hereby incorporated by reference.

BACKGROUND OF THE INVENTION

Technical Field of the Invention

The present disclosure is related to a method for updating a firmware, and more particularly to a method for updating a firmware of a complex programmable logic device in a server.

Description of the Related Art

In the development, testing and maintenance of the server, it is often necessary to update a complex programmable logic device (CPLD). Lattice company's offline programmer (Diamond Programmer) also needs the support of the hardware JTAG connector, so the versatility is poor. Therefore, some developers developed a software tool (fcpld_v1.0) that can update the firmware version of the CPLD to get rid of the hardware constraints.

However, in the program of the CPLD update software, the set value of the integrated circuit bus is set to a fixed value, and if the set value of the integrated circuit bus of the base management controller (BMC) configured to connected to the CPLD a is different from the set value of the CPLD update software, the CPLD update software cannot perform the function of burning the CPLD by the integrated circuit bus of the baseboard management controller, and must modify the set value of the integrated circuit bus in the program of the CPLD update software. Therefore, such a CPLD update tool that fixes the set value of the integrated circuit bus bar in advance is not versatile. On the other hand, the current way to enable a hitless enable pin of the CPLD is to plug the jumper cap to enable the hitless enable pin of the CPLD. However, this method will make the hardware more complex.

In view of the foregoing situations, there is indeed a need for an improved method for updating the firmware of the CPLD, which at least may improve above shortcomings.

SUMMARY OF THE INVENTION

According to one embodiment of the present disclosure, a method for updating a firmware of a complex programmable logic device is provided, there is no hardware constraint when performing a firmware update, and there is no need to consider a set value of an integrated circuit bus of a baseboard management controller, which greatly improves the versatility and convenience on different motherboards.

According to an embodiment of the present disclosure, a method for updating a firmware of a complex programmable logic device is provided, and the method comprising: electrically connecting a general purpose input/output pin of a baseboard management controller with a hitless enable pin of a complex programmable logic device; electrically connecting a first integrated circuit bus of the baseboard management controller with a second integrated circuit bus of the complex programmable logic device; inputting and transmitting a update command to the baseboard management controller by a local operating system; enabling the hitless enable pin by the baseboard management controller according to the update command; cleaning a first firmware in the complex programmable logic device by the baseboard management controller according to the update command; and burning a second firmware into the complex programmable logic device by the baseboard management controller according to the update command.

According to the method for updating the firmware of the complex programmable logic device, the update command includes a general purpose input/output pin parameter, an integrated circuit bus parameter, and an updated file address.

According to the method for updating the firmware of the complex programmable logic device, wherein the baseboard management controller enables the hitless enable pin according to the general purpose input/output pin parameter.

According to the method for updating the firmware of the complex programmable logic device, wherein the baseboard management controller cleans the first firmware according to the integrated circuit bus parameter.

The method for updating the firmware of the complex programmable logic device further comprises: formatting the complex programmable logic device by the baseboard management controller according to the integrated circuit bus parameter before burning the second firmware into the complex programmable logic device and after cleaning the first firmware.

The method for updating the firmware of the complex programmable logic device further comprises: downloading the second firmware from a memory according to the updated file address before burning the second firmware into the complex programmable logic device and after cleaning the first firmware.

According to the method for updating the firmware of the complex programmable logic device, wherein the baseboard management controller burns the second firmware into the complex programmable logic device according to the integrated circuit bus parameter.

According to one embodiment of the present disclosure, a method for updating a firmware of a complex programmable logic device is provided. After a user inputs and transmits a general purpose input/output pin parameter, an integrated circuit bus parameter, and an update file address to the baseboard management controller by a local operating system, the baseboard management controller enables the hitless enable pin according to the general purpose input/output pin parameter and burns a new version of a firmware into the complex programmable logic device. Because the user inputs an integrated circuit bus parameter only when the user needs to update a firmware of the complex programmable logic device, the integrated circuit bus parameter for updating the firmware is not a fixed value, which improves the versatility and convenience of the firmware update on different motherboards. On the other hand, it also ensures that a server system does not shut down and the baseboard management controller is not restarted when updating the firmware.

The above description of the disclosure and the following descriptions of the embodiments of the present disclosure are intended to illustrate and explain spirits and principles of the present disclosure.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
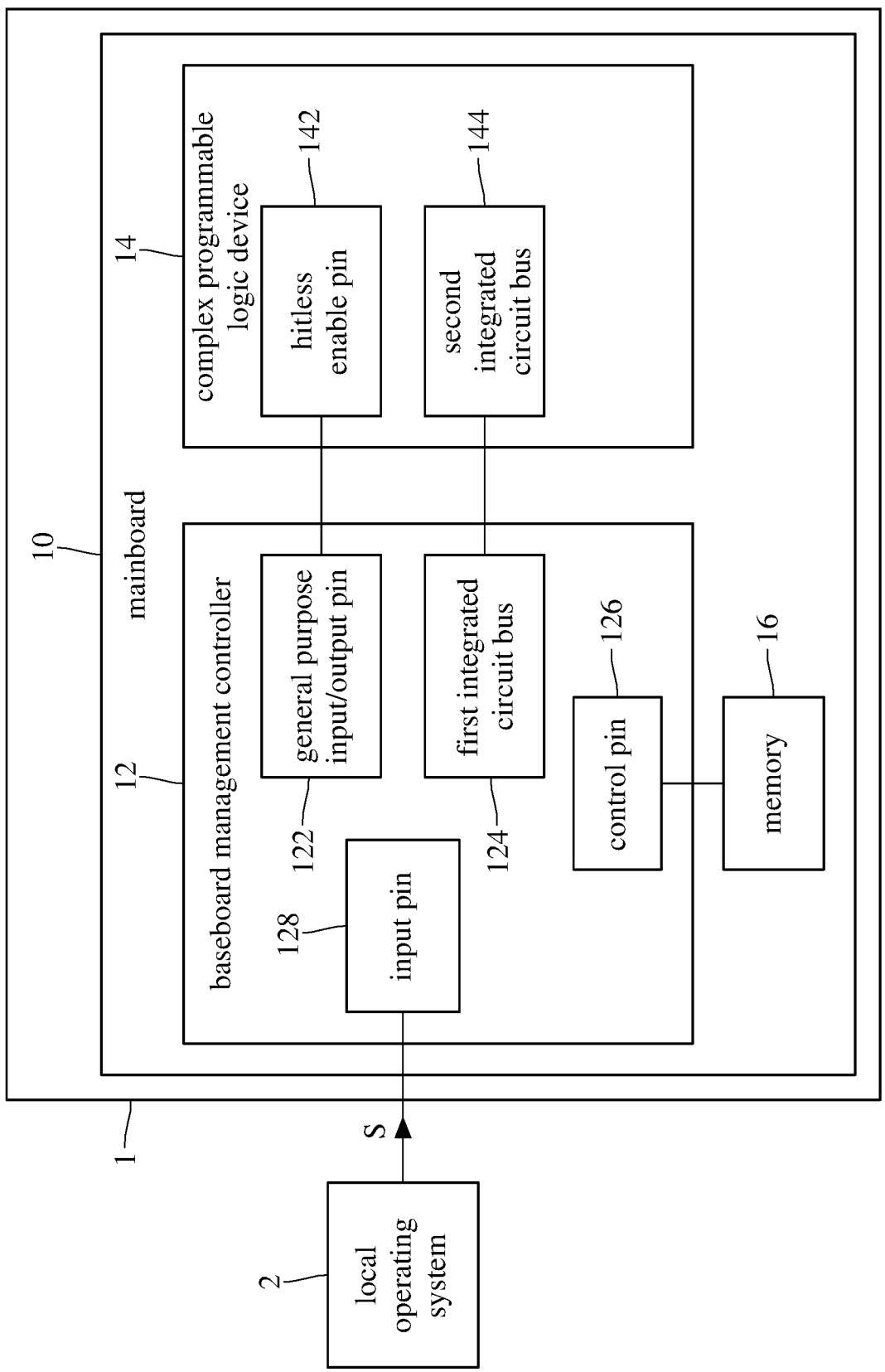
FIG. 1 is an architecture diagram of hardware devices in a server in accordance with an embodiment of the present disclosure.

FIG. 1 is an architecture diagram of hardware devices in a server in accordance with an embodiment of the present disclosure. As shown in FIG. 1, a server 100 comprises a mainboard 10 and a baseboard management controller 12, a complex programmable logic device 14 and a memory 16. The baseboard management controller 12, the complex programmable logic device 14 and the memory 16 are electrically connected with the mainboard 10. The baseboard management controller 12 has a general purpose input/output pin 122, a first integrated circuit bus 124, a control pin 126 and an input pin 128, and the complex programmable logic device 14 has a hitless enable pin 142 and a second integrated circuit bus 144. The general purpose input/output pin 122 of the baseboard management controller 12 is electrically connected with the hitless enable pin 142 of the complex programmable logic device 14, the first integrated circuit bus 124 of the baseboard management controller 12 is electrically connected with the second integrated circuit bus 144 of the complex programmable logic device 14, and the control pin 126 of the baseboard management controller 12 is electrically connected with the memory 16. A user may input and transmit an update command S to the input pin 128 of the baseboard management controller 12 by a local operating system 2, and the update command S inputted by the user may include a general purpose input/output pin parameter, an integrated circuit bus parameter and an update file address. Thereby, the baseboard management controller 12 may first clean an old firmware in the complex programmable logic device 14 according to the content of the update command S, and then burn another firmware stored in the memory 16 into the complex programmable logic device 14.

Figure 2:
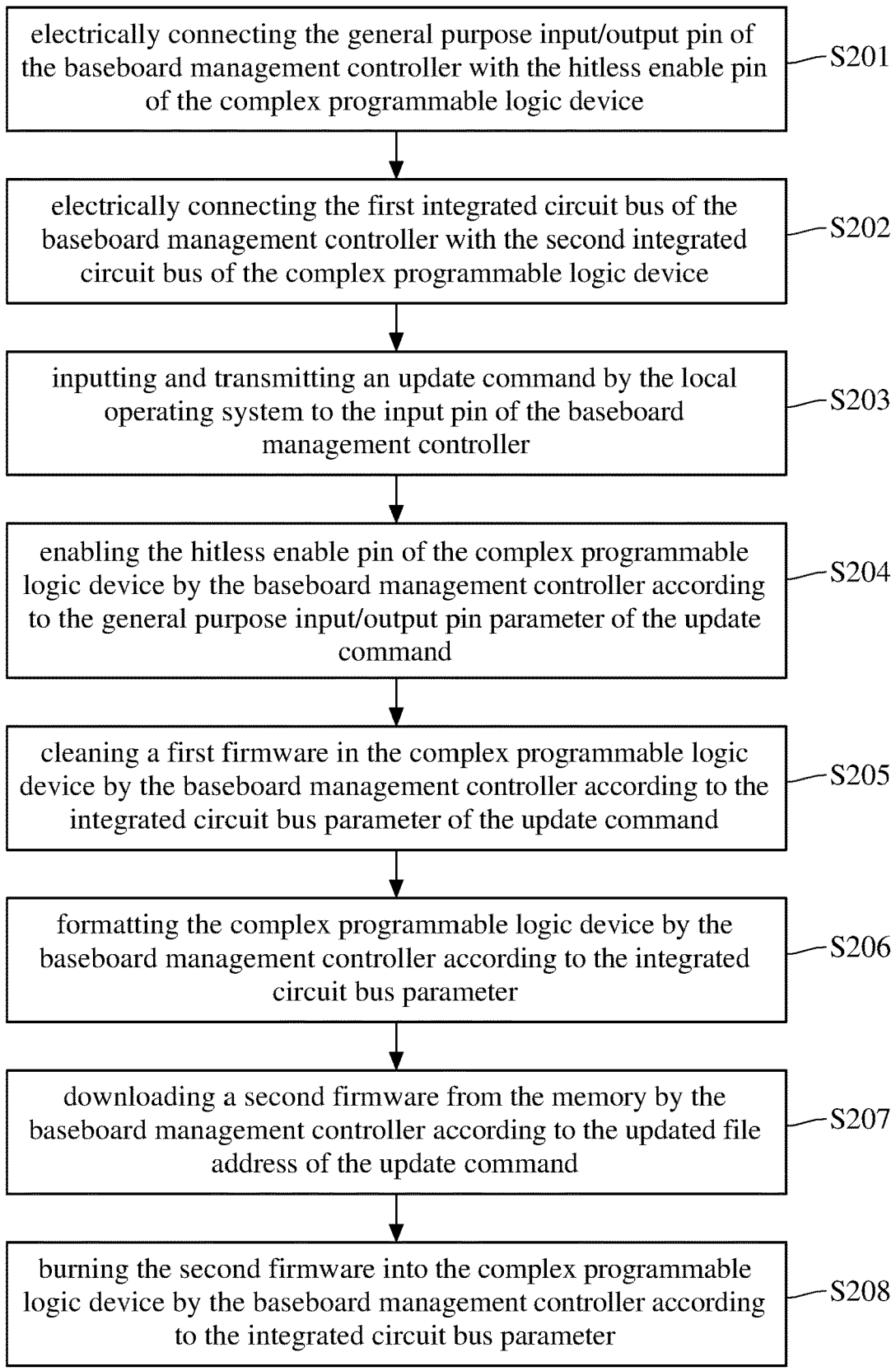
FIG. 2 is a flowchart of a method for updating a firmware of a complex programmable logic device in accordance with a first embodiment of the present disclosure.

FIG. 2 is a flowchart of a method for updating a firmware of a complex programmable logic device in accordance with a first embodiment of the present disclosure. Referring to FIG. 1 and FIG. 2 together, in step S201, electrically connecting the general purpose input/output pin 122 of the baseboard management controller 12 with the hitless enable pin 142 of the complex programmable logic device 14. In step S202, electrically connecting the first integrated circuit bus 124 of the baseboard management controller 12 with the second integrated circuit bus 144 of the complex programmable logic device 14. In another embodiment, step S201 and step S202 may be reversed in sequence, or may be performed simultaneously. In step S203, a user input and transmit an update command S by the local operating system 2 to the input pin 128 of the baseboard management controller 12 when the user needs to update a firmware of the complex programmable logic device 14, and the update command S inputted by the user may include a general purpose input/output pin parameter, an integrated circuit bus parameter and an updated file address. In step S204, enabling the hitless enable pin 142 of the complex programmable logic device 14 by the baseboard management controller 12 according to the general purpose input/output pin parameter of the inputted update command S. In step S205, cleaning a first firmware stored in the complex programmable logic device 14 by the baseboard management controller 12 according to the integrated circuit bus parameter of the inputted update command S. In step S206, formatting the complex programmable logic device 14 by the baseboard management controller 12 according to the integrated circuit bus parameter of the inputted update command S. In step S207, downloading a second firmware from a storage location of the memory 16 by the baseboard management controller 12 according to the updated file address of the inputted update command S. In step S208, burning the second firmware downloaded from the memory 16 into the complex programmable logic device 14 by the baseboard management controller 12 according to the integrated circuit bus parameter of the inputted update command S.

Figure 3:
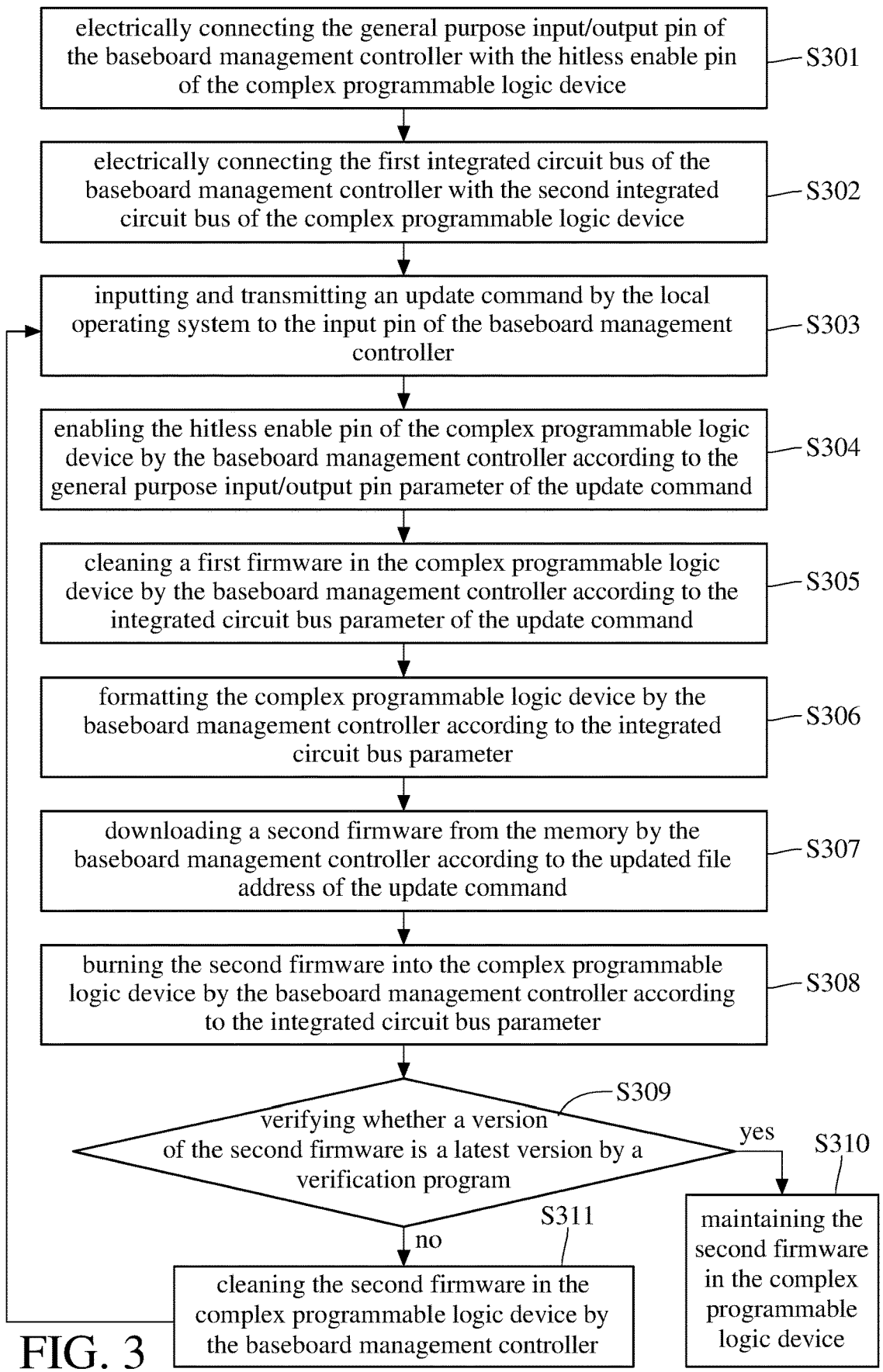
FIG. 3 is a flowchart of a method for updating a firmware of a complex programmable logic device in accordance with a second embodiment of the present disclosure.

FIG. 3 is a flowchart of a method for updating a firmware of a complex programmable logic device in accordance with a second embodiment of the present disclosure. The contents of steps S301 to S308 of FIG. 3 are the same as the contents of steps S201 to S208 of FIG. 2, and FIG. 3 further comprises steps S309 to S311. In step S309, verifying whether a version of the second firmware is a latest version by a verification program after burning the second firmware into the complex programmable logic device 14. If the verification program verifies that the version of the second firmware is the latest version, step S310 is performed. If the verification program verifies that the version of the second firmware is not the latest version, step S311 is performed. In step S310, maintaining the second firmware in the complex programmable logic device 14. In step S311, cleaning the second firmware in the complex programmable logic device 14 by the baseboard management controller 12 and then returning to step S303. After returning to step S303, when the user inputs a new update command and an updated file address of the new update command indicates that the version of the second firmware downloaded from another new storage location of the memory 16 by the baseboard management controller 12 is the latest version, stop performing steps S309 to S311.

According to an embodiment of the present disclosure, a method for updating a firmware of a complex programmable logic device is provided. After a user inputs and transmits a general purpose input/output pin parameter, an integrated circuit bus parameter, and an update file address to the baseboard management controller by a local operating system, the baseboard management controller enables the hitless enable pin and burns a new version of a firmware into the complex programmable logic device according to the general purpose input/output pin parameter. Because the user inputs the integrated circuit bus parameter only when the user needs to update the firmware of the complex programmable logic device, the integrated circuit bus parameter for updating the firmware is not a fixed value, which improves the versatility and convenience of the firmware update on different motherboards. On the other hand, it also ensures that a server system does not shut down and the baseboard management controller is not restarted when updating the firmware.

Although the present disclosure has been disclosed above in the foregoing embodiments, it is not intended to limit this invention. It is within the scope of this invention to be modified and modified without departing from the spirit and scope of the invention. Please refer to the attached claims for the scope of protection defined by the present invention.

What is claimed is:

1. A method for updating a firmware of a complex programmable logic device, comprising:
   electrically connecting a general purpose input/output pin of a baseboard management controller with a hitless enable pin of the complex programmable logic device;
   electrically connecting a first integrated circuit bus of the baseboard management controller with a second integrated circuit bus of the complex programmable logic device;
   inputting and transmitting an update command to the baseboard management controller by a local operating system wherein the update command includes a general purpose input/output pin parameter an integrated circuit bus parameter and an updated file address;
   enabling the hitless enable pin by the baseboard management controller according to the update command;
   cleaning a first firmware in the complex programmable logic device by the baseboard management controller according to the update command;
   burning a second firmware into the complex programmable logic device by the baseboard management controller according to the update command after cleaning the first firmware in the complex programmable logic device; and
   downloading the second firmware from a memory by the baseboard management controller according to the updated file address before burning the second firmware into the complex programmable logic device and after cleaning the first firmware.

2. The method in claim 1, wherein the baseboard management controller enables the hitless enable pin according to the general purpose input/output pin parameter.

3. The method in claim 1, wherein the baseboard management controller cleans the first firmware according to the integrated circuit bus parameter.

4. The method in claim 1, further formatting the complex programmable logic device by the baseboard management controller according to the integrated circuit bus parameter before burning the second firmware into the complex programmable logic device and after cleaning the first firmware.

5. The method in claim 1, wherein the baseboard management controller burns the second firmware into the complex programmable logic device according to the integrated circuit bus parameter.

6. The method in claim 1, further comprising verifying whether a version of the second firmware is a latest version by a verification program after burning the second firmware into the complex programmable logic device, maintaining the second firmware in the complex programmable logic device if the version of the second firmware is the latest version, cleaning the second firmware and returning to a process of inputting the update command if the version of the second firmware is not the latest version.

* * * * *